United States Patent
Matsuo et al.

(10) Patent No.: US 7,939,891 B2
(45) Date of Patent: May 10, 2011

(54) SEMICONDUCTOR DEVICE HAVING MISFETS AND MANUFACTURING METHOD THEREOF

(75) Inventors: Kouji Matsuo, Yokohama (JP); Katsunori Yahashi, Yokohama (JP); Takashi Shinyama, Kanagawa (JP)

(73) Assignees: Kabushiki Kaisha Toshiba, Tokyo (JP); Sony Corporation, Tokyo (JP)

(*) Notice: Subject to any disclaimer, the term of this patent is extended or adjusted under 35 U.S.C. 154(b) by 226 days.

(21) Appl. No.: 12/409,092

(22) Filed: Mar. 23, 2009

(65) Prior Publication Data
US 2009/0256178 A1    Oct. 15, 2009

(30) Foreign Application Priority Data
Apr. 10, 2008 (JP) .................................. 2008-102631

(51) Int. Cl.
*H01L 27/12* (2006.01)
(52) U.S. Cl. ........ 257/351; 257/369; 257/382; 257/384; 257/E27.06
(58) Field of Classification Search .................. 257/351, 257/369, 382, 384, E27.06
See application file for complete search history.

(56) References Cited

U.S. PATENT DOCUMENTS
2007/0200170 A1   8/2007   Yamasaki et al.
2008/0061370 A1   3/2008   Matsuo
2008/0237732 A1   10/2008  Mori et al.

FOREIGN PATENT DOCUMENTS
JP    2006-186240    7/2006

*Primary Examiner* — Hoai V Pham
*Assistant Examiner* — Elias Ullah
(74) *Attorney, Agent, or Firm* — Finnegan, Henderson, Farabow, Garrett & Dunner, L.L.P.

(57) ABSTRACT

A semiconductor device includes a dielectric film and gate electrode that are stacked on a substrate, sidewalls formed to cover the side surfaces of the electrode and dielectric film, and SiGe films formed to sandwich the sidewalls, electrode and dielectric film, filled in portions separated from the sidewalls, having upper portions higher than the surface of the substrate and having silicide layers formed on regions of exposed from the substrate. The lower portion of the SiGe film that faces the electrode is formed to extend in a direction perpendicular to the surface of the substrate and the upper portion is inclined and separated farther apart from the gate electrode as the upper portion is separated away from the surface of the substrate. The surface of the silicide layer of the SiGe film that faces the gate electrode is higher than the channel region.

8 Claims, 7 Drawing Sheets

SEMICONDUCTOR DEVICE HAVING MISFETS AND MANUFACTURING METHOD THEREOF

CROSS-REFERENCE TO RELATED APPLICATIONS

This application is based upon and claims the benefit of priority from prior Japanese Patent Application No. 2008-102631, filed Apr. 10, 2008, the entire contents of which are incorporated herein by reference.

BACKGROUND OF THE INVENTION

1. Field of the Invention

This invention relates to a semiconductor device and a manufacturing method thereof and more particularly to a semiconductor device having MISFETs that are designed to improve the performance and reliability and a manufacturing method thereof.

2. Description of the Related Art

Recently, much attention is paid to the technique for enhancing the mobility of carriers (electrons) in the channels of pMOSFETs that are one type of MISFETs. As one example thereof, source and drain portions of pMOSFETs are first recessed in the technique described in Jpn. Pat. Appln. KOKAI Publication No. 2006-186240. Then, a silicon-germanium (SiGe) film is filled in the recessed regions by use of a selective epitaxial growth technique. Next, stress from the SiGe film is applied to the recessed regions to give compressive stresses to the channels of the pMOSFETs and cause strain in Si. Thus, the mobility of carriers (charges) in the channels of the pMOSFETs is enhanced.

The above technique is called an eSiGe technique, for example. However, if the above structure and manufacturing method are used, the following problems (1) to (4) tend to occur in the MOSFET manufacturing process.

(1) Problem Related to Film Formation of SiGe Film:

In order to form a high-quality SiGe film, it is necessary to sufficiently remove oxygen and carbon adhered to the surfaces of recessed regions in the preprocess step. In order to attain this, it is desirable to subject the surfaces of the recessed regions to a hydrofluoric acid process by a sufficiently large etching amount. However, since the gate sidewalls are generally formed of silicon dioxide ($SiO_2$) and also etched in the hydrofluoric acid process, an amount to be etched is limited. Further, if the gate sidewalls are generally formed of $SiO_2$ films by use of an LP-CVD method, the etching rate thereof becomes several times higher than that of an $SiO_2$ film formed by thermal oxidation. Therefore, for example, if the gate sidewall is formed of a CVD-$SiO_2$ film having an etching rate which is five times that of a thermal oxide film and the gate sidewall is formed to a thickness of approximately 20 nm, the gate sidewall will be eliminated when an SiGe film with a film thickness of as small as approximately 4 nm is etched. As a result, SiGe films will be formed on the side surfaces of the gate electrode. Thus, it is difficult to adequately perform a preprocess step for the SiGe film.

(2) Problem Related to Filling of Offset Sidewall:

In order to solve the problem (1), for example, it is only required to form the gate sidewalls by use of silicon nitride (SiN) films. However, if the gate sidewalls are formed of SiN films, an SiGe film tends to be formed into a shape in which it rises from the surface of the silicon substrate to cover the surfaces of the gate sidewalls like the shape formed by use of the normal epitaxial growth method. That is, if the gate sidewalls are formed of SiN films, the surface of the SiGe film that faces the gate sidewall is formed into a reversed taper form in which it is inclined and set closer to the gate sidewall as it is separated away from the surface of the silicon substrate. In the SiGe film having no so-called facet, offset sidewalls are formed not only on the sidewall portions of the gate electrode but also on the sidewalls of the SiGe film that faces the gate electrode in an offset sidewall formation step that is a later step.

For example, it is supposed that the relation of $L<2OS_W$ is set between the distance L from the side surface of the gate electrode that faces the SiGe film to the junction portion between the SiGe film and an extension diffusion layer and the thickness $OS_W$ of the offset sidewall. In this case, an extension diffusion layer formation region of the silicon substrate surface that is exposed between the gate electrode and the SiGe film will be filled with an offset sidewall material in the offset sidewall formation step. Further, even if the relation of $L>2OS_W$ is set between L and $2OS_W$, an offset sidewall will be formed on the sidewall of the SiGe film that faces the gate electrode as described before. Therefore, a region used to from an extension diffusion layer is markedly reduced. As a result, the parasitic resistance of a MOSFET is increased and the performance thereof is lowered.

(3) Problem Related to Lowering in Reliability of Gate Oxide Film in Gate Edge:

In the step of removing the gate sidewalls, edge portions of the gate oxide film are exposed and etched. Therefore, the reliability of the edge portion of the gate oxide film and the reliability of the MOSFET are degraded.

(4) Problem Related to Entry of Silicide into Channel Portion:

In the general eSiGe technique, an SiGe film is formed into such a shape that it gets into under a gate sidewall formed in a later step. If a nickel silicide (NiSi) film is formed on the SiGe film with the above shape, there occurs a possibility that the NiSi film will be formed into the internal portion of the extension diffusion layer region below the gate sidewall. Therefore, the reliability of the MOSFET may be degraded and a junction leak may occur in the extension diffusion layer region.

BRIEF SUMMARY OF THE INVENTION

According to one aspect of this invention, there is provided a semiconductor device which includes gate electrodes on a main surface of a semiconductor substrate through gate dielectric films, first silicide layers on upper portions of the gate electrodes, first sidewalls to cover side surfaces of the gate electrodes, the first silicide layers and side surfaces of the gate dielectric films, silicon-germanium films respectively to sandwich the first sidewalls, gate electrodes and gate dielectric films, filled in surface-layer portions of the semiconductor substrate in positions separated from the first sidewalls and having upper portions to reach a position higher than the surface of the semiconductor substrate, second silicide layers on surface-layer portions of regions of the silicon-germanium films that are exposed from the semiconductor substrate, and second sidewalls each to cover a surface extending from an intermediate portion of a side surface of the silicon-germanium film that faces the gate electrode to a portion that contacts with the surface of the semiconductor substrate, a surface of the first sidewall and the surface of the semiconductor substrate exposed from the first sidewall and gate dielectric film, wherein a lower end portion of the side surface of each silicon-germanium film that faces the gate electrode is formed in a planar shape along a direction perpendicular to the surface of the semiconductor substrate, an upper portion lying above the lower end portion is formed in a planar shape that is inclined and set to be separated farther apart from the gate electrode as the upper portion is separated away from the surface of the semiconductor substrate and the surface of the second silicide layer formed at least on the side portion of the silicon-germanium film that faces the gate electrode is set in a position higher than a channel region lying below the gate electrode.

According to another aspect of this invention, there is provided a semiconductor device manufacturing method which includes forming first sidewalls that are formed to cover side surfaces of gate dielectric films and gate electrodes formed on a main surface of a semiconductor substrate and whose lower end portions are set to extend along the main surface of the semiconductor substrate, forming second sidewalls formed of a material different from that of the first sidewall to cover surfaces of the first sidewalls, digging at least portions of surface-layer portions of the semiconductor substrate that are exposed from the gate dielectric films, gate electrodes, first sidewalls and second sidewalls to form recessed regions, cleaning surfaces of the semiconductor substrate that are exposed in the recessed regions, the second sidewalls being removed at time of the cleaning, forming silicon-germanium films into the recessed regions until upper portions thereof reach a position higher than the surface of the semiconductor substrate, removing at least portions of the first sidewalls that are formed to extend along the main surface of the semiconductor substrate and forming first sidewalls to cover the side surfaces of the gate dielectric films and gate electrodes and partly expose the surfaces of the semiconductor substrate that lie between the gate dielectric films and gate electrodes and the silicon-germanium films, forming impurity diffusion layers on the surface-layer portions of the semiconductor substrate with the first sidewalls, gate dielectric films and gate electrodes used as a mask, forming second sidewalls each of which covers a surface extending from an intermediate portion of a side surface of the silicon-germanium film that faces the gate electrode to a portion that contacts with the surface of the semiconductor substrate, a surface of the first sidewall and a surface of the impurity diffusion layer, and forming silicide layers on upper portions of the gate electrodes and surface-layer portions of regions of the silicon-germanium films that are exposed from the semiconductor substrate.

DETAILED DESCRIPTION OF THE INVENTION

First Embodiment

A semiconductor device according to a first embodiment of this invention and a manufacturing method thereof are explained with reference to FIG. 1, FIGS. 2A, 2B, FIG. 3, FIGS. 4A, 4B, FIG. 5, FIGS. 6A, 6B, FIGS. 7A, 7B and FIG. 8.

The present embodiment shows the structure of a MISFET that is designed to improve the performance and reliability and a manufacturing method thereof. More specifically, like the conventional eSiGe technique, SiGe films are filled in the source and drain portions of a pMOSFET and stress (compressive stress) is applied to the channel to cause strain in Si and enhance the mobility of carriers. Further, SiGe films are filled into recessed portions used as the source and drain diffusion regions by a selective epitxial growth method before forming extension diffusion layers.

Unlike the conventional eSiGe technique, in this embodiment, the gate sidewall is formed of a two-layer structure having a lower-layer SiN film and an upper-layer $SiO_2$ film. Then, after recessed portions used as the source and drain diffusion regions are formed and the surfaces of the recessed portions are sufficiently subjected to a cleaning process by use of dilute hydrofluoric acid or the like, SiGe films are formed. With the above structure and manufacturing method, all of the problems (1) to (4) can be solved.

Next, this embodiment is specifically explained in detail.

Figure 1:
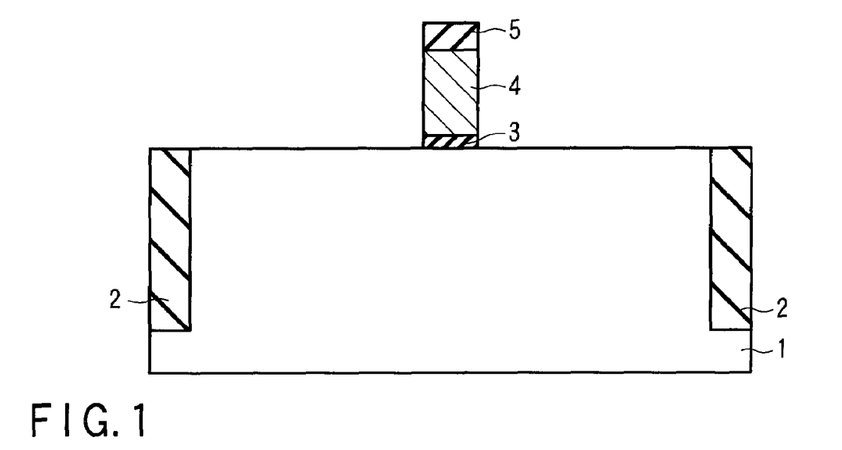
FIG. 1 is a cross-sectional view showing a first manufacturing step of a semiconductor device according to a first embodiment of this invention.

First, as shown in FIG. 1, dielectric films 2 such as $SiO_2$ films are filled in the surface portions of a silicon substrate 1 used as a semiconductor substrate to form an element isolation region with a shallow trench isolation (STI) structure. Then, a gate dielectric film 3 formed of SiON with a film thickness of approximately 1 nm, for example, is formed on the main surface of the silicon substrate 1. Subsequently, a gate electrode 4 is formed on the gate dielectric film 3 by use of polysilicon (poly-Si), for example. After this, in order to prevent an SiGe film 10 from being formed on the upper surface of the gate electrode 4 in the film formation step of the SiGe film 10 which will be described later, a hard mask 5 is formed on the upper surface of the gate electrode 4 by use of an SiN film, for example.

Figure 2A:
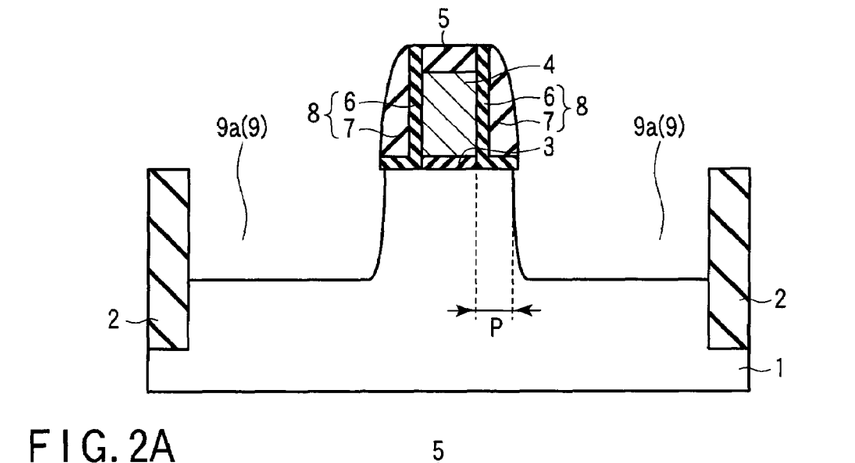
FIG. 2A is a cross-sectional view showing a second manufacturing step of the semiconductor device according to the first embodiment of this invention.

Next, as shown in FIG. 2A, gate sidewalls 8 are formed. Specifically, first gate sidewalls 6 are first formed to cover the gate dielectric film 3, gate electrode 4, hard mask 5 and the surfaces of portions of the silicon substrate 1 that lie adjacent to the gate dielectric film 3. As the first gate sidewall 6, an SiN film with a film thickness of approximately 5 nm is used and the cross section thereof becomes an L-shaped or reversed L-shaped (inverted L-shaped) cross section. Then, second gate sidewalls 7 are formed to cover the surfaces of the first gate sidewalls 6. As the second gate sidewall 7, an $SiO_2$ film whose thickest portion has a film thickness of approximately 15 nm is used. Thus, the gate sidewalls 8 with a two-layer structure are each formed by stacking the SiN film 6 and $SiO_2$ film 7 to cover the side surfaces of the gate dielectric film 3, gate electrode 4 and hard mask 5.

Next, the Si layers of regions of the surface-layer portion of the silicon substrate 1 in which source and drain layers 15 of a pMOSFET 17 are formed are dry-etched to form recessed regions 9 with the gate sidewalls 8 and hard mask 5 used as a mask. At this time, as shown in FIG. 2A, the Si layer mainly exposed from the gate sidewalls 8 and hard mask 5 is etched in a vertical direction by use of the dry-etching technique having strong anisotropy. By the above etching process, the recessed regions 9a are each formed into a box shape whose bottom surface is made substantially flat.

Figure 2B:
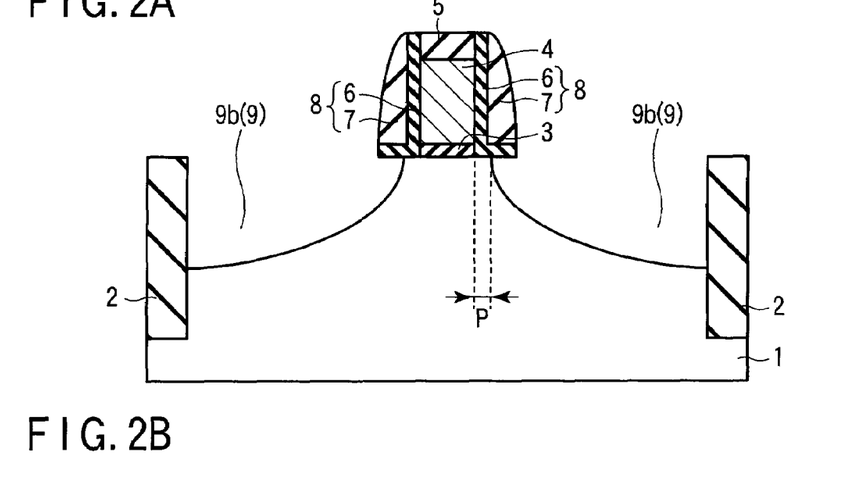
FIG. 2B is a cross-sectional view for illustrating another example of the second manufacturing step shown in FIG. 2A.

Alternatively, it is possible to etch the Si layer not only in the vertical direction but also in the lateral direction by use of the dry-etching technique having weak anisotropy. In this case, as shown in FIG. 2B, portions of the Si layer that lie below the gate sidewalls 8 are partly etched. As a result, recessed regions 9b are each formed into a bowl shape having a curved bottom surface.

However, a permissible range is set for the etching amount of the Si layer lying below the gate sidewall 8. That is, the ranges indicated by P in FIGS. 2A and 2B respectively indicate the distances (gaps) between SiGe films formed later in the recessed regions 9a, 9b and the channels of the pMOSFETs. As the range indicated by P becomes narrower (shorter), compressive stress applied from the SiGe film to the channel is increased and the channel resistance can be made lower. However, if the range indicated by P becomes excessively shorter, there occurs a possibility that impurity such as boron (B) doped in the SiGe film will be diffused from the SiGe film to the exterior to degrade the short-channel effect. The inventors of this application studied the range of P in which the above trade-off relation can be set in a well-balanced state and proved that it was desirable to set P to approximately 5 to 30 nm.

Further, the depths of the recessed regions 9a, 9b are not particularly limited, but stresses applied to the channels tend to become larger as the recessed regions 9a, 9b become deeper. On the other hand, if the recessed regions 9a, 9b become excessively deeper, the number of crystal defects in the SiGe film tends to be increased. Therefore, it is necessary to optimize the depths of the recessed regions 9a, 9b. As the result of the study by the inventor of this application and others, it was proved desirable to set the depths of the recessed regions 9a, 9b to approximately 20 to 200 nm.

Figure 3:
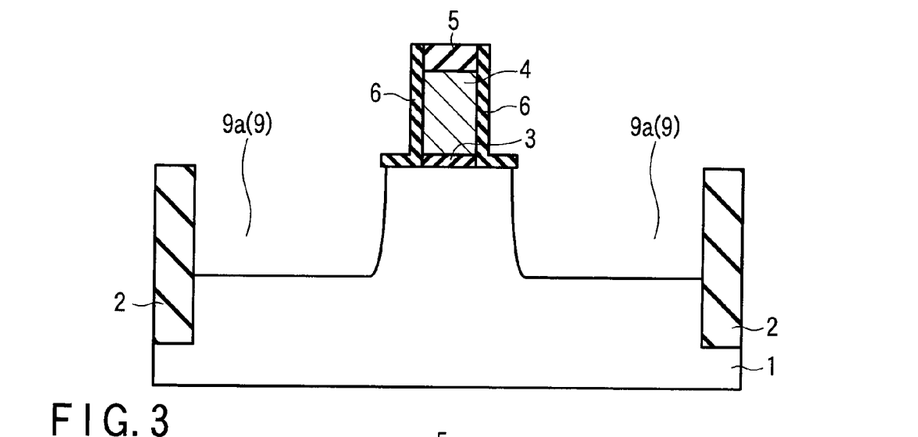
FIG. 3 is a cross-sectional view showing a third manufacturing step of the semiconductor device according to the first embodiment of this invention.

Next, as shown in FIG. 3, a preprocess step for forming SiGe films 10 is performed for the silicon substrate 1 having the recessed regions 9a formed thereon. In this embodiment, the SiGe film 10 with the germanium (Ge) concentration of approximately 20% is formed in each recessed region 9a by use of a selective epitaxial growth technique. For this purpose, prior to formation of the SiGe films 10, it is necessary to sufficiently remove natural oxide films (not shown) formed on the surfaces of the recessed regions 9a by use of dilute hydrofluoric acid, for example. Alternatively, it is important to remove impurities such as oxygen, carbon and the like adhered to the surfaces of the recessed regions 9a prior to formation of the SiGe films 10. Further, it is preferable to perform the annealing process at a temperature of approximately 800° C. while a chamber (not shown) used for film formation of the SiGe films 10 is being filled with a gas atmosphere containing at least hydrogen before causing gas for film formation of the SiGe films 10 to flow into the film formation chamber.

With the conventional eSiGe technique, there occurs a problem that the gate sidewall will be eliminated by performing the preprocess since the gate sidewall is formed of a single-layer $SiO_2$ film. On the other hand, in this embodiment, the gate sidewall 8 is formed with the stacked structure having the first gate sidewall 6 formed of an SiN film and the second gate sidewall 7 formed of an $SiO_2$ film. Therefore, as shown in FIG. 3, even if the preprocess is performed until the second gate sidewall 7 ($SiO_2$ film) is eliminated, the SiN film that is the first gate sidewall 6 is kept left on the silicon substrate 1. Thus, there occurs no possibility that the side surfaces of the gate dielectric film 3 and gate electrode 4 are exposed even if the second gate sidewall 7 is eliminated by performing the preprocess. Therefore, it becomes possible to sufficiently perform the preprocess until impurities such as a natural oxide film are substantially completely removed from the surfaces of the recessed regions 9a. For this reason, the preprocess is performed by use of dilute hydrofluoric acid, for example, until the $SiO_2$ film that is the second gate sidewall 7 among the gate sidewall 8 with the upper and lower two-layer stacked structure is eliminated.

Figure 4A:
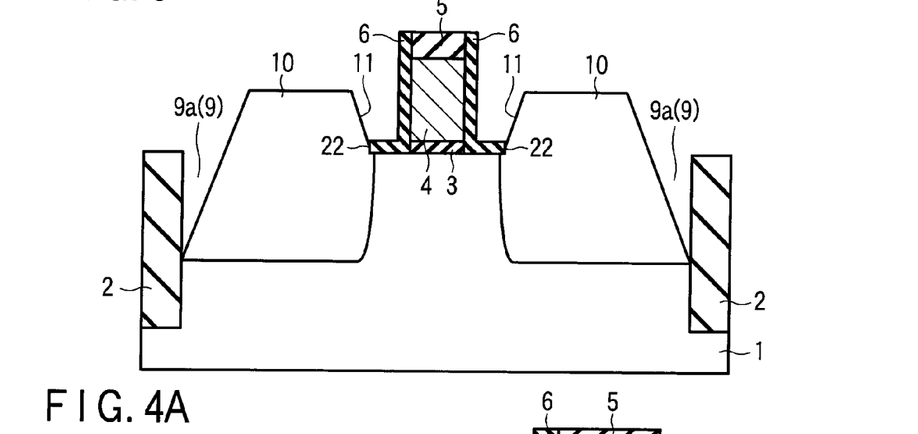
FIG. 4A is a cross-sectional view showing a fourth manufacturing step of the semiconductor device according to the first embodiment of this invention.
Figure 4B:
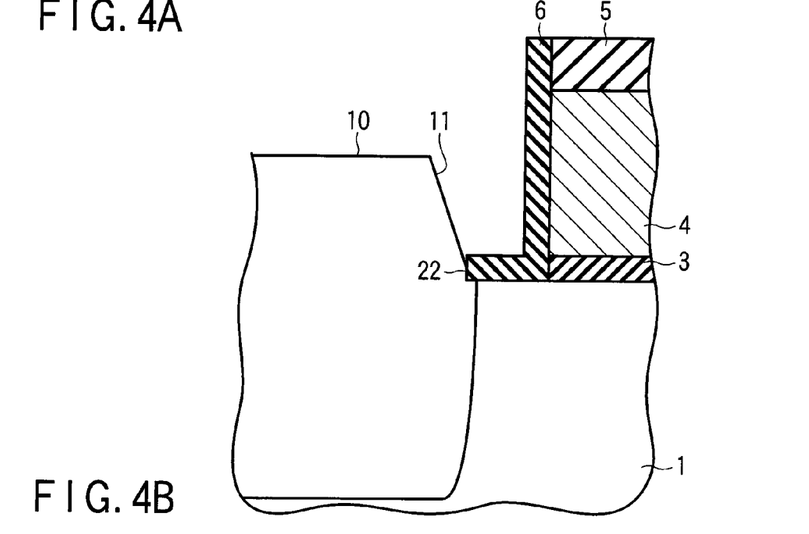
FIG. 4B is a cross-sectional view showing an enlarged portion of a gate edge portion of FIG. 4A.

Next, as shown in FIG. 4A, SiGe films 10 are formed in the recessed regions 9a. Specifically, the SiGe films 10 with the Ge concentration of approximately 20% are filled in the recessed regions 9a by use of a selective epitaxial growth technique. At this time, as film formation gas for the SiGe films 10, a mixture of monosilane ($SiH_4$) (or dichlorosilane ($SiH_2Cl_2$)), germanium hydroxide ($GeH_4$) and hydrochloric acid (HCl) is generally used. In FIG. 4B, an enlarged portion of a gate edge portion of FIG. 4A is shown.

In the conventional eSiGe technique, the gate sidewall is formed of a single-layer $SiO_2$ film. Therefore, if an SiGe film is formed to a position higher than the channel surface that is the surface of the silicon substrate, a facet is formed to extend from a portion lying directly above the surface of the silicon substrate on the side surface among the surfaces of the SiGe film that faces the gate sidewall. The facet has a taper shape that is inclined and separated farther apart from the gate electrode (gate sidewall) as it is separated away from the surface of the silicon substrate and is formed with a (111) surface or (311) surface, for example.

On the other hand, in this embodiment, only the first gate sidewalls 6 that are each formed of an SiN film are left behind on the surface of the silicon substrate 1 at the time of selective epitaxial growth of SiGe films 10. In this state, as shown in FIG. 4B, if the selective epitaxial growth of SiGe films 10 is performed and even when the SiGe films 10 have reached a position higher than the surface of the silicon substrate 1 (channel surface), facets 11 are not formed on the side surfaces of the SiGe films 10 that face the first gate sidewalls 6 (or gate electrode 4) until the SiGe films 10 reach the height corresponding to the thickness of the SiN film that is the first gate sidewall 6. The SiGe films 10 grow in a direction perpendicular to the surface of the silicon substrate 1 until they reach the height corresponding to the thickness of the SiN film 6. That is, the lower end portion of the side surface of the SiGe film 10 that faces the first gate sidewall 6 is formed into a facetless shape. Then, if the SiGe film 10 becomes higher than the height corresponding to the film thickness of the SiN film 6, the SiGe film 10 is further epitaxially grown while it is forming a facet 11 configured by a (111) surface or (311) surface on the side surface thereof that faces the first gate sidewall 6. That is, a facetless portion 22 is formed on a portion of the SiGe film 10 that lies near the surface of the silicon substrate 1 and a facet 11 that is continuous to the facetless portion 22 is formed directly above the facetless portion 22.

A preset amount of impurity may be contained in the SiGe film 10. For example, after the SiGe film 10 is epitaxially grown to preset size, boron (B) of approximately $1 \times 10^{18}$ to $1 \times 10^{20}$ atoms/cm$^3$ may be doped into the SiGe film 10 by an ion-implantation process. Alternatively, boron may be doped into the SiGe film while it is being epitaxially grown. In this case, it is common practice to add $B_2H_6$ gas to the mixed gas used for formation of the SiGe films 10. By introducing boron into the SiGe films 10, the parasitic resistances of the source and drain portions can be reduced and p-n junction leaks can be reduced. On the other hand, however, if boron is excessively doped into the SiGe film 10, there occurs a possibility that the short channel effect will be degraded due to diffusion of boron from the SiGe film 10 to the exterior. Therefore, the impurity concentration in the SiGe film 10 is set to an adequate value. As the result of the study by the inventor of this application and others, it was proved that it was preferable to set the impurity concentration of the SiGe film 10 within a range of 0 to $2 \times 10^{20}$ atoms/cm$^3$.

Further, in this embodiment, the SiGe film 10 is formed with such film thickness that it reaches a position higher than the channel surface of a pMOSFET. Thus, sufficiently large channel stress can be stably applied to the channel region from the SiGe film 10.

Figure 5:
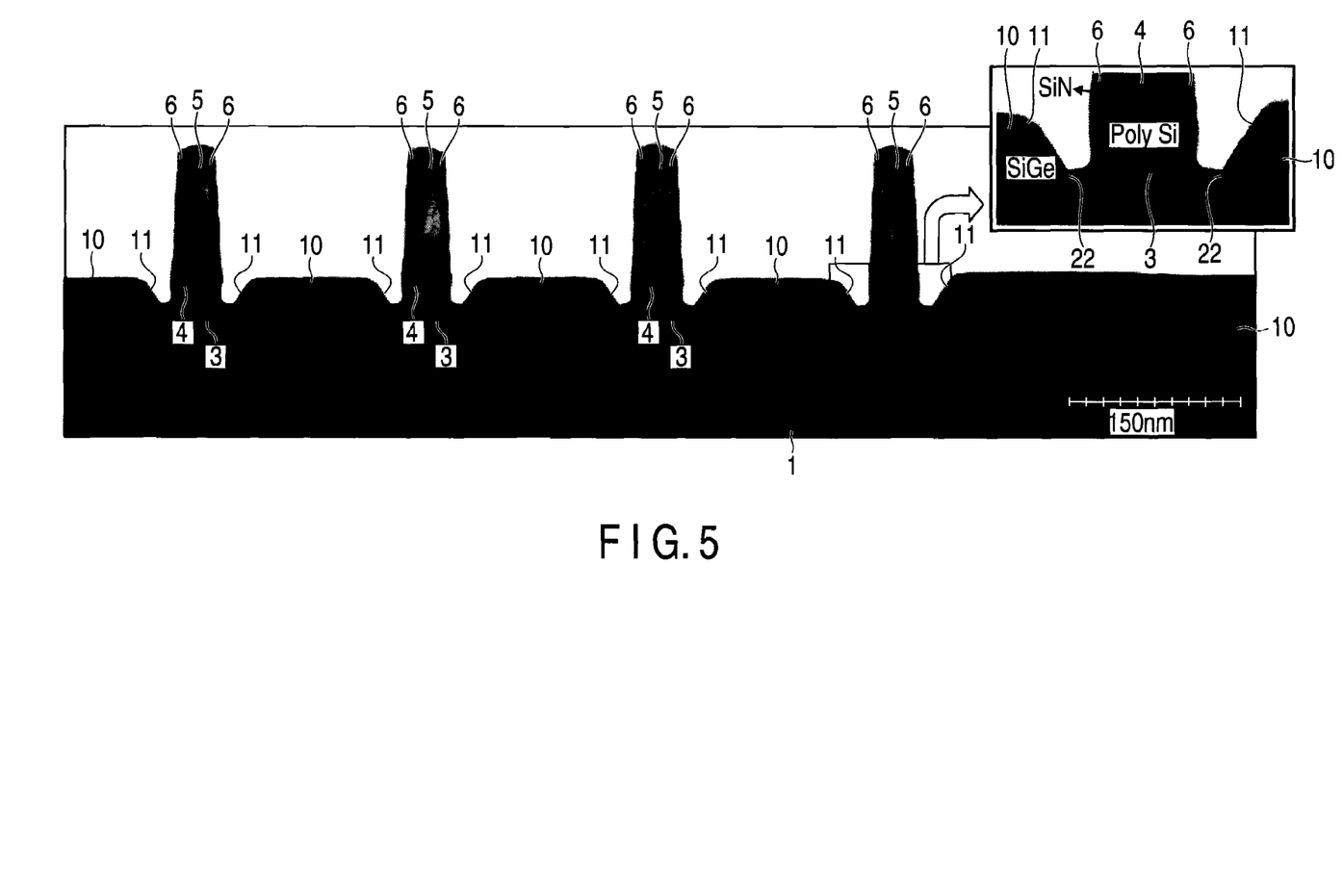
FIG. 5 is a STEM image showing the cross section of a structure formed by applying a manufacturing method of the semiconductor device according to the first embodiment of this invention.

FIG. 5 shows a STEM image of a structure formed by applying the above steps to an actual semiconductor device manufacturing process. According to the STEM image, it is understood that the structure shown in FIG. 5 is substantially the same as the structure shown in FIG. 4A except the element isolation regions 2 and gate dielectric film 3.

Figure 6A:
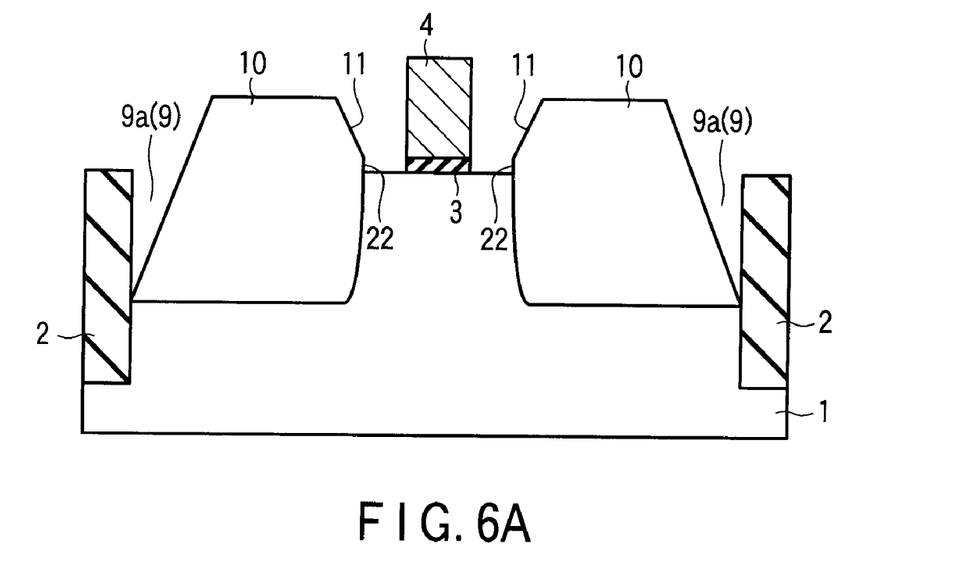
FIG. 6A is a cross-sectional view showing a fifth manufacturing step of the semiconductor device according to the first embodiment of this invention.

Next, as shown in FIG. 6A, the hard mask 5 formed of an SiN film and the first gate sidewalls 6 are etched and removed by use of hot phosphoric acid, for example. At this time, in this embodiment, since the gate sidewall 6 is formed of an SiN film, there occurs almost no possibility that the edge portions of the gate oxide film 3 will be etched even if the first gate sidewalls 6 are removed and the edge portions of the gate oxide film 3 formed of an SiO$_2$ film are exposed.

Figure 6B:
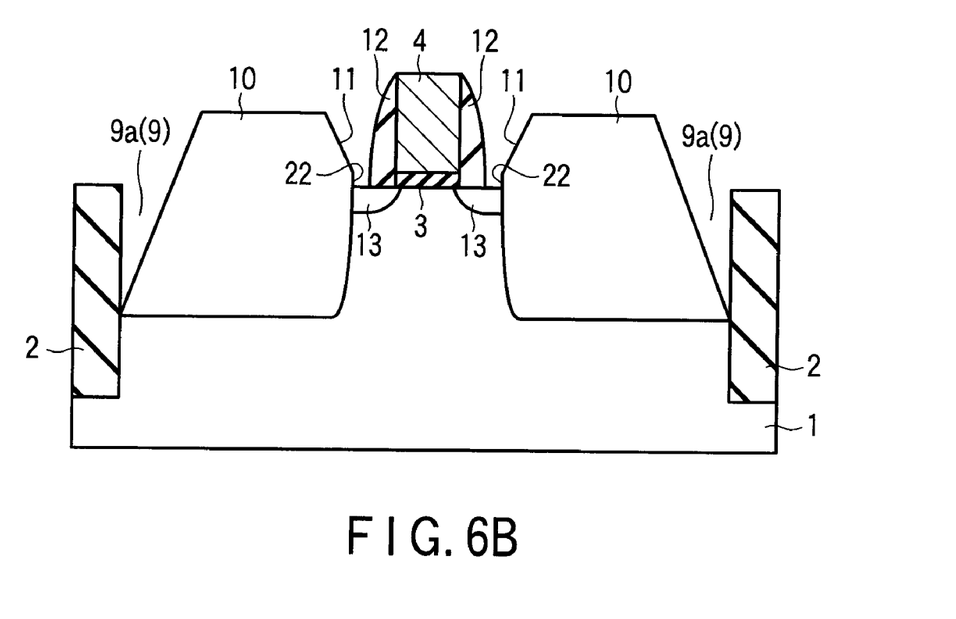
FIG. 6B is a cross-sectional view showing a sixth manufacturing step of the semiconductor device according to the first embodiment of this invention.

Then, as shown in FIG. 6B, offset sidewalls 12 are formed to cover the side surfaces of the gate oxide film 3 and gate electrode 4. In this case, as the offset sidewall 12, an SiO$_2$ film with a thickness of approximately 5 to 10 nm is used. Subsequently, a normal ion-implantation process and annealing process are performed with the offset sidewalls 12, gate oxide film 3 and gate electrode 4 used as a mask. As a result, extension diffusion layers 13 acting as portions of the source and drain regions are formed on the surface portions of the silicon substrate 1. The offset sidewalls 12 used for formation of the extension diffusion layers 13 are also substantially one type of gate sidewalls. In this embodiment, the offset sidewalls 12 are left behind on the silicon substrate 1 as final lower-layer gate sidewalls (first sidewalls).

In the conventional eSiGe technique, if an SiN film is used to prevent the gate sidewalls from being eliminated in the preprocess of the SiGe film formation step, SiGe films of an inverted taper shape tend to be formed. The inverted taper shape is a shape in which the surface of the SiGe film that faces the gate sidewall is inclined and set closer to the gate electrode (gate sidewall) as it is separated away from the surface of the silicon substrate. If SiGe films having no facet are formed, offset sidewalls formed of an SiO$_2$ film will be formed on the surface portions of the SiGe films in the later step of the SiGe film formation step. Further, if the relation between the distance L between the SiGe film and the gate electrode and the thickness OS$_W$ of the offset sidewall is not adequately set, extension diffusion layer formation regions may become extremely narrow or the extension diffusion layer formation regions will be filled with an offset sidewall material.

However, in this embodiment, even if the lower-layer portions of the gate sidewalls 8 are formed of the SiN films 6, SiGe films 10 with a taper shape can be formed. The taper shape is a shape in which the surface of the SiGe film that faces the gate electrode 4 (first gate sidewall 6) is inclined and separated farther apart from the gate electrode 4 (first gate sidewall 6) as it is separated away from the surface of the silicon substrate 1. That is, SiGe filler films 10 having facets 11 formed on the side surfaces thereof that face the first gate sidewalls 6 can be formed. Therefore, as shown in FIG. 6B, even if offset gate sidewalls 12 formed of an SiO$_2$ film are formed in the later step of the formation step of the SiGe filler films 10, there occurs almost no possibility that SiO$_2$ films are formed on the surface-layer portions of the SiGe filler films 10. Further, there occurs almost no possibility that extension diffusion layer formation regions may become extremely narrow or the extension diffusion layer formation regions will be filled with the SiO$_2$ films 12.

Figure 7A:
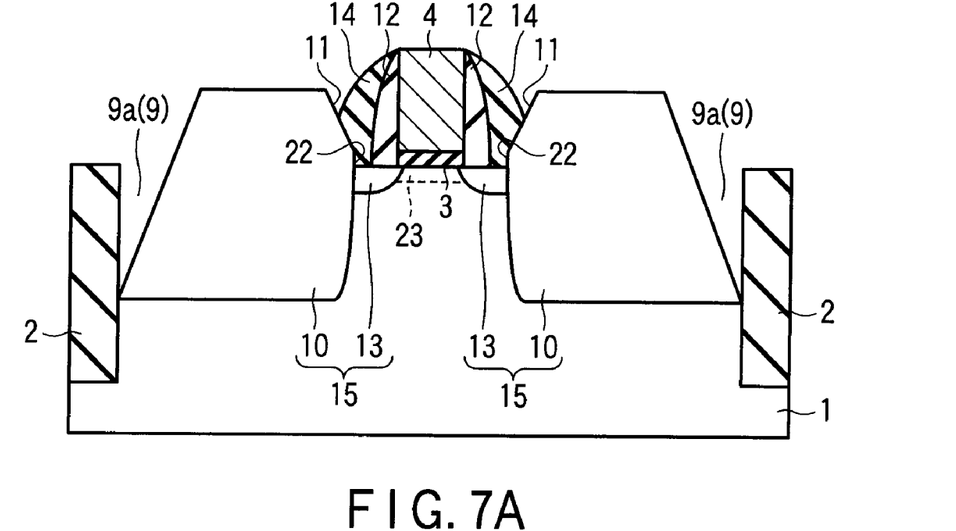
FIG. 7A is a cross-sectional view showing a seventh manufacturing step of the semiconductor device according to the first embodiment of this invention.

Next, as shown in FIG. 7A, third gate sidewalls 14 are formed to cover the surfaces of the offset sidewalls 12 and extension diffusion layers 13. At this time, the surfaces of the facetless portions 22 lying directly above the surface of the silicon substrate 1 and the surfaces lying below the intermediate portions of the facets 11 among the side surfaces of the SiGe filler films 10 that face the offset sidewalls 12 are also covered with the third gate sidewalls 14. In this case, for example, the third gate sidewall 14 is formed of an SiN film. In this embodiment, the third gate sidewalls 14 are left behind on the silicon substrate 1 as final upper-layer gate sidewalls (second sidewalls). That is, the offset gate sidewalls 12 used as lower-layer gate sidewalls formed of SiO$_2$ films and the third gate sidewalls 14 used as upper-layer gate sidewalls formed of SiN films are left behind as final gate sidewalls of two-layer structures on the silicon substrate 1.

Subsequently, impurity such as boron is doped into the SiGe filler films 10, diffused and activated by performing a normal ion-implantation process and annealing process. Thus, source and drain diffusion layers 15 formed of the extension diffusion layers 13 and SiGe filler films 10 are formed on the surface-layer portions of the silicon substrate 1. Further, a portion sandwiched by the two extension diffusion layers 13 formed on the surface-layer portions of the silicon substrate 1 to sandwich the gate dielectric film 3, gate electrode 4 and first gate sidewalls 6 acts as a channel region 23. If impurity such as boron is contained in the SiGe filler film 10, it is not always necessary to perform the ion-implantation process. However, an ion-implantation process at the time of formation of source and drain diffusion layers 15 may be used as an additional ion-implantation process in order to reduce the parasitic resistances of pMOSFETs and the impurity concentration of the SiGe filler film 10 may be adjusted and set to a more appropriate value.

Figure 7B:
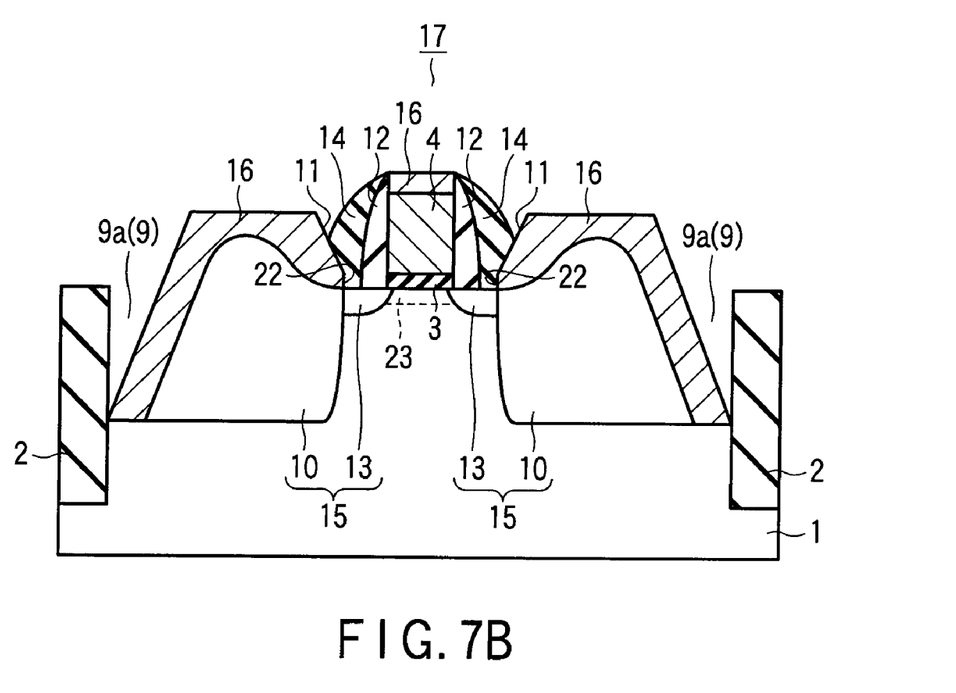
FIG. 7B is a cross-sectional view showing an eighth manufacturing step of the semiconductor device according to the first embodiment of this invention.

Next, as shown in FIG. 7B, silicide layers 16 are formed on the surface-layer portion of the gate electrode 4 and the surface-layer portions of the SiGe filler films 10 that form the source and drain diffusion layers 15 by use of a normal salicide technique. In this case, NiSi layers are formed, for example.

With the conventional SiGe technique, NiSi layers were formed into the internal portions of extension diffusion layers lying below the gate sidewalls. On the other hand in this embodiment, as shown in FIGS. 4A and 4B, the facetless regions 22 in which the SiGe films 10 are formed at right angles with respect to the surface of the silicon substrate 1 are present on the lower end portions of the side portions of the SiGe films 10 that face the first gate sidewalls 6 and lie above the surface of the silicon substrate 1 (the surface of the channel region 23). The height of the facetless region 22 from the surface of the silicon substrate 1 substantially corresponds to the film thickness of the first gate sidewall 6 formed of an SiN film. The facetless region 22 functions as a stopper to prevent the NiSi layer 16 from entering (invading) the silicon substrate (Si layer) 1. At this time, the surfaces of the extension diffusion layers 13 are entirely covered with the third gate sidewalls 14. As a result, there occurs almost no possibility that the NiSi layers 16 extend to portions of the extension diffusion layers 13 lying near the edge portions of the gate electrode 4.

Further, in this embodiment, the facetless regions 22 are formed above the surface of the silicon substrate 1 in portions near the junction portions between the SiGe filler films 10 and the extension diffusion layers 13. Therefore, the NiSi layers 16 are formed with at least the surfaces thereof set above the surface of the silicon substrate 1 (the surface of the channel region 23) in the side portions of the SiGe filler films 10 that face the gate electrode 4. However, more preferably, it is preferable to form the whole portions of the NiSi layers 16 above the surface of the channel region 23 in the side portions of the SiGe filler films 10 that face the gate electrode 4. At this time, it becomes possible to more effectively suppress the NiSi layers 16 from entering (invading) the extension diffusion layers 13 in comparison with a case wherein the surface of the NiSi layer 16 is set higher than the surface of the channel region 23.

By the above process, as shown in FIG. 7B, a pMOSFET 17 having a structure in which the SiGe films 10 having the NiSi layers 16 formed on the surface-layer portions are filled into the formation regions of the source and drain diffusion layers 15 is formed on the surface-layer portion of the silicon substrate 1.

So far, the structure in which only the pMOSFET 17 having the SiGe filler films 10 is formed on the surface-layer portion of the silicon substrate 1 and the manufacturing method thereof are explained. However, in a case where an nMOSFET or a pMOSFET having no SiGe filler films 10 is formed on the same substrate 1 of the pMOSFET 17, the following process may be added, for example.

Although not shown in the drawing, a region on the silicon substrate 1 in which an nMOSFET or a pMOSFET having no SiGe filler films 10 is formed is covered with a resist film before the dry-etching process is performed to form recessed regions 9 in the surface-layer portions of the silicon substrate 1 after the gate dielectric film 3, gate electrode 4, hard mask 5 and the gate sidewalls 8 configured by the first gate sidewalls 6 and second gate sidewalls 7 are formed on the silicon substrate 1. In this state, the region on the silicon substrate 1 in which the pMOSFET 17 is to be formed is subjected to the dry-etching process for forming the recessed regions 9. At this time, the region in which the nMOSFET or the pMOSFET having no SiGe filler films 10 is to be formed is set in a state in which stacked films of SiN films used as the first gate sidewalls 6 and SiO$_2$ films used as the second gate sidewalls 7 are formed.

Figure 8:
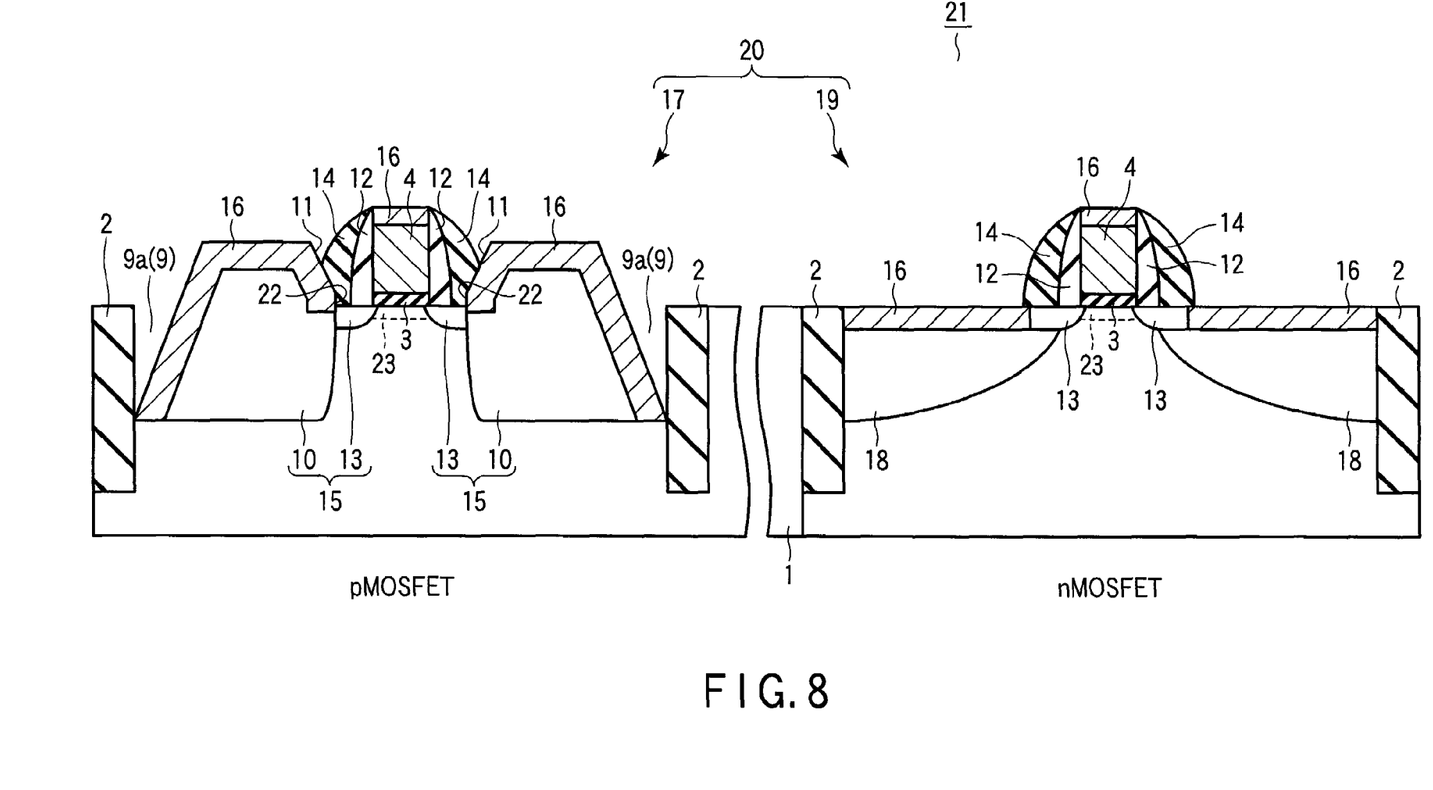
FIG. 8 is a cross-sectional view showing a ninth manufacturing step of the semiconductor device according to the first embodiment of this invention.

Next, in the region in which the pMOSFET 17 is to be formed, various processes after the dry-etching process for forming the recessed regions 9 are performed. At the same time, in the region in which the nMOSFET or the pMOSFET having no SiGe filler films 10 is formed, the resist film that covers the above region is removed. Then, a normal process for forming the nMOSFET or the pMOSFET having no SiGe filler films 10 is performed. By performing the above process, as shown in FIG. 8, the pMOSFET having the SiGe filler films 10 and an nMOSFET 19 having NiSi layers 16 formed on the surface-layer portions of source and drain diffusion layers 18 are formed on the same silicon substrate 1. That is, a semiconductor device 21 having a CMOS structure 20 configured by the pMOSFET 17 and nMOSFET 19 can be realized.

As described above, in the first embodiment, the gate sidewall 8 is formed with the two-layer structure having the first gate sidewall 6 formed of the SiN film and the second sidewall 7 formed of the SiO$_2$ film. As a result, the first gate sidewalls 6 formed of the SiN film will not be eliminated even if the etching process using a large amount of dilute hydrofluoric acid is performed in the preprocess of the film formation process of the SiGe filler films 10. Thus, since the preprocess using a sufficient etching amount can be performed, there occurs almost no possibility that SiGe films 10 are formed on the side surfaces of the gate electrode 4.

Further, in this embodiment, even if the lower-layer portions of the gate sidewalls 8 are formed of the SiN films 6, the SiGe films 10 having facets 11 formed on the side surfaces thereof that face the first gate sidewalls 6 can be formed. Thus, even if offset sidewalls 12 formed of SiO$_2$ films are formed in the later process of the film formation process of the SiGe films 10, SiO$_2$ films can be substantially prevented from being formed on the surface-layer portions of the SiGe films 10. Further, it is possible to substantially prevent occurrence of the possibility that extension diffusion layer formation regions will become extremely narrow or the extension diffusion layer formation regions will be filled with the SiO$_2$ films 12. As a result, the offset gate sidewalls 12 used to form extension diffusion layers 13 can be formed of SiO$_2$ films while the first gate sidewalls 6 are prevented from being eliminated in the preprocess of the film formation process of the SiGe filler films 10. Thus, the parasitic resistance of the pMOSFET 17 can be reduced and the performance of the pMOSFET 17 or the semiconductor device 21 having the pMOSFET 17 can be enhanced.

Further, in this embodiment, the first gate sidewalls 6 are formed of SiN films. Therefore, even if the first gate sidewalls 6 are removed and the edge portions of the gate oxide film 3 formed of an SiO$_2$ film are exposed, there occurs almost no possibility that the edge portions of the gate oxide film 3 will be etched. Thus, the possibility that the reliability of the edge portions of the gate oxide film 3 is degraded can be substantially suppressed and the reliability of the edge portions of the gate oxide film 3 can be maintained. As a result, the reliabilities of the pMOSFET 17 and the semiconductor device 21 having the pMOSFET 17 can be substantially prevented from being degraded.

Further, in this embodiment, the facetless regions 22 in which the SiGe films 10 are set to be perpendicular to the surface of the silicon substrate 1 are formed on the lower end portions of the SiGe films 10 that face the side portions of the first gate sidewalls 6 and lie above the surface of the silicon substrate 1 (the surface of the channel region). As a result, the NiSi layers 16 can be substantially prevented from being spread and formed to extend to portions in the extension diffusion layers 13 that lie near the edge portions of the gate electrode 4. Thus, it can be made difficult that junction leaks occur in the extension diffusion layers 13 among the source and drain diffusion layers 15. Further, the reliabilities of the pMOSFET 17 and the semiconductor device 21 having the pMOSFET 17 can be substantially prevented from being degraded.

Thus, according to this embodiment, the MISFET 17 with the SiGe structure capable of solving the problems (1) to (4) caused by the eSiGe technique can be formed. Therefore, according to this embodiment, the semiconductor device 21 having the pMOSFET 17 whose performance and reliability can be enhanced and the manufacturing method thereof can be provided.

Second Embodiment

A semiconductor device according to a second embodiment of this invention and a manufacturing method thereof are explained with reference to FIGS. 9A, 9B and FIG. 10. Portions that are the same as those of the first embodiment are denoted by the same symbols and the detailed explanation thereof is omitted. The present embodiment is different from the first embodiment in that the first gate sidewalls 6 formed of the SiN films in the first embodiment are processed without being removed and used as offset sidewalls to from extension diffusion layers 13. The other portions are almost the same as those of the first embodiment.

The present embodiment is concretely explained in detail below.

First, the process up to the step of forming the SiGe filler films 10 on the surface-layer portions of the silicon substrate 1 is the same as the process explained with reference to FIG. 1, FIGS. 2A, 2B, FIG. 3 and FIG. 4A in the first embodiment.

Figure 9A:
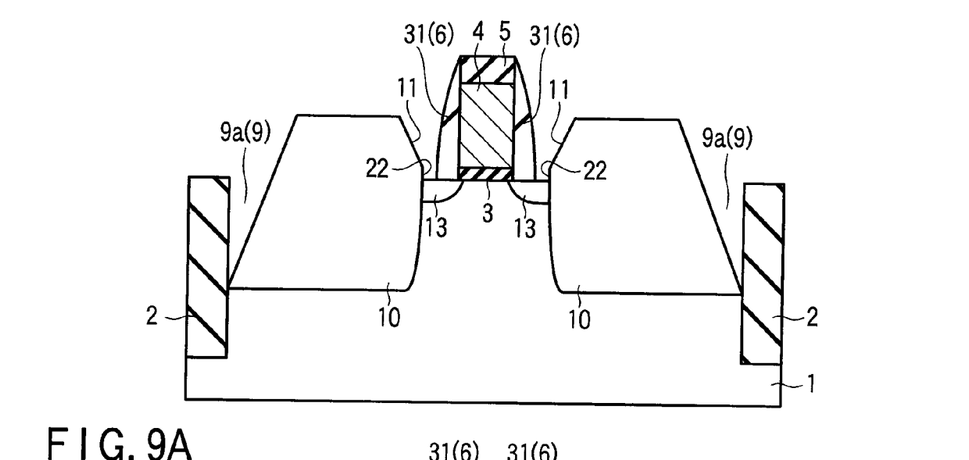
FIG. 9A is a cross-sectional view showing a first manufacturing step of a semiconductor device according to a second embodiment of this invention.

Next, as shown in FIG. 9A, the first gate sidewalls 6 formed of SiN films are etched back by use of an anisotropic dry-etching technique. Thus, the first gate sidewalls 6 with an L-shaped or reversed L-shaped cross section are left behind to cover the side surfaces of the gate oxide film 3, gate electrode 4 and hard mask 5 to form offset gate sidewalls 31. In this embodiment, the offset gate sidewalls 31 are left behind on the silicon substrate 1 as final lower-layer gate sidewalls. Then, extension diffusion layers 13 are formed by the same method as that of the first embodiment with the gate oxide film 3, gate electrode 4, hard mask 5 and offset gate sidewalls 31 used as a mask.

Figure 9B:
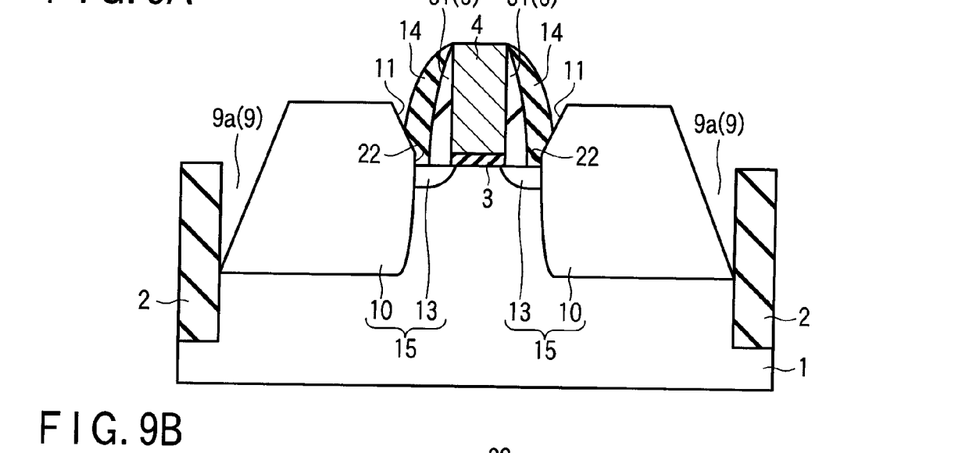
FIG. 9B is a cross-sectional view showing a second manufacturing step of the semiconductor device according to the second embodiment of this invention.

Next, as shown in FIG. 9B, third gate sidewalls 14 formed of SiN films are formed to cover the offset gate sidewalls 31 and extension diffusion layers 13. At this time, the surfaces of the facetless portions 22 lying directly above the surface of the silicon substrate 1 and the surfaces of the lower portions lying below the intermediate portions of facets 11 among the side surfaces of the SiGe filler films 10 that face the offset gate sidewalls 31 are also covered with the third gate sidewalls 14. In this embodiment, the third gate sidewalls 14 are left behind on the silicon substrate 1 as final upper-layer gate sidewalls. That is, the offset gate sidewalls 31 used as lower-layer gate sidewalls formed of SiN films and the third gate sidewalls 14 used as final upper-layer gate sidewalls formed of the same SiN films as those of the offset gate sidewalls 31 are left behind on the silicon substrate 1 as final gate sidewalls of two-layer structures. Then, the hard mask 5 formed of an SiN film is removed by dry etching.

Figure 10:
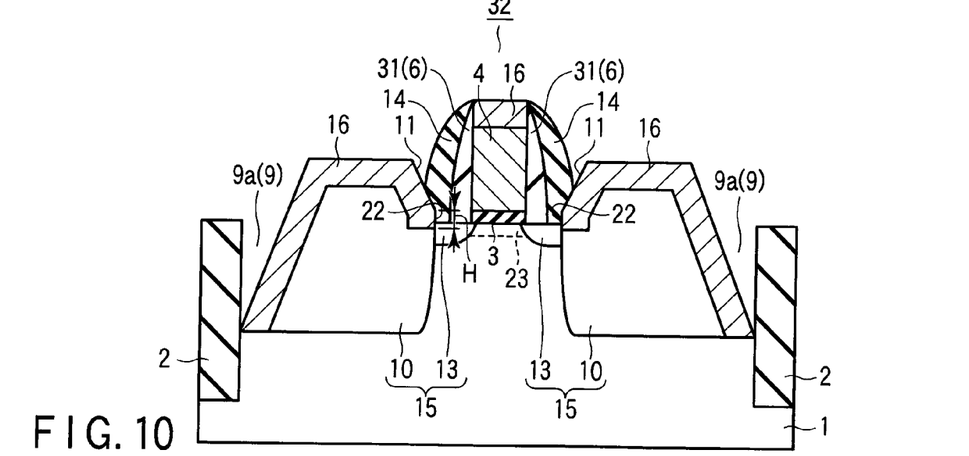
FIG. 10 is a cross-sectional view showing a third manufacturing step of the semiconductor device according to the second embodiment of this invention.

Next, as shown in FIG. 10, source and drain diffusion layers 15 formed of the extension diffusion layers 13 and SiGe filler films 10 are formed on the surface-layer portions of the silicon substrate 1 by performing a normal ion-implantation process and annealing process. Then, silicide layers 16 formed of NiSi layers are formed on the surface-layer portion of the gate electrode 4 and the surface-layer portions of the SiGe films 10 that form the source and drain diffusion layers 15 by use of a normal silicide technique.

By the process explained so far, a pMOSFET 32 having a structure in which the SiGe films 10 having the NiSi layers 16 formed on the surface-layer portions thereof are filled in the formation regions of the source and drain diffusion layers 15 is formed on the surface-layer portion of the silicon substrate 1.

As explained above, according to the second embodiment, the same effect as that explained in the first embodiment can be attained. Further, in this embodiment, the first gate sidewalls 6 used as the basic layers of the offset gate sidewalls 31 are previously formed prior to formation of the SiGe filler films 10. Thus, it becomes possible to basically solve a problem that the offset gate sidewalls 31 are formed not only on the gate sidewall portions but also on the sidewall portions of the SiGe filler films 10 that face the gate sidewall portions or the extension diffusion layer filling regions are filled with the offset gate sidewalls 31.

In this embodiment, the side surfaces of the gate oxide film 3 are kept covered with the first gate sidewalls 6 or offset gate sidewalls 31 after the first gate sidewalls 6 are formed. Therefore, occurrence of a problem that the edge portions of the gate oxide film 3 are exposed and etched can be basically prevented. As a result, since the post-oxidation process for protecting the edge portions of the gate oxide film 3 becomes unnecessary, the number of manufacturing steps of a semiconductor device can be reduced and the production efficiency can be enhanced.

Further, like the first embodiment, in this embodiment, the facetless portions 22 are formed on the lower-end portions of the side portions of the SiGe films 10 that face the gate sidewalls 8 and lie above the surface of the silicon substrate 1 (the surface of the channel region). The height of the facetless portion 22 indicated by "H" in FIG. 10 is set almost equal to the film thickness of the SiN film used as the first gate sidewall 6. As a result, a junction leak can be made difficult to occur in the extension diffusion layer 13 and the reliabilities of the pMOSFET 17 and a semiconductor device 21 having the pMOSFET 17 can be substantially prevented from being degraded.

The semiconductor device of this invention and the manufacturing method thereof are not limited to the first and second embodiments. For example, in the first and second embodiments, the silicide layers 16 formed of NiSi layers are formed on the surface-layer portions of the gate electrode 4 and SiGe filler films 10. However, a material of the silicide layer 16 is not limited to the NiSi layer. The silicide layer 16 can be formed of a silicide layer containing a noble metal such as Co, Pt, Pd or a base metal such as Ti, Er or a silicide layer of an alloy containing two or more of the above metal elements other than the NiSi layer.

Further, it is not always necessary to uniformly set the Ge concentration in the SiGe filler film 10 to approximately 20%. The Ge concentration in the SiGe filler film 10 may be set to different values in respective portions of the SiGe filler film 10. For example, the Ge concentration in a portion of the SiGe filler film 10 that lies below the surface of the silicon substrate 1 may be set to approximately 20% and the Ge concentration in a portion of the SiGe filler film 10 that lies above the surface of the silicon substrate 1 may be set to approximately 5%.

As described above, according to one aspect of this invention, a semiconductor device having MISFETs designed to enhance the performance and reliability and a manufacturing method thereof can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   gate electrodes on a main surface of a semiconductor substrate through gate dielectric films,
   first silicide layers on upper portions of the gate electrodes,
   first sidewalls to cover side surfaces of the gate electrodes, the first silicide layers and side surfaces of the gate dielectric films,
   silicon-germanium films respectively to sandwich the first sidewalls, gate electrodes and gate dielectric films, filled in surface-layer portions of the semiconductor substrate in positions separated from the first sidewalls and having upper portions to reach a position higher than the surface of the semiconductor substrate,
   second silicide layers on surface-layer portions of regions of the silicon-germanium films that are exposed from the semiconductor substrate, and
   second sidewalls each to cover a surface extending from an intermediate portion of a side surface of the silicon-germanium film that faces the gate electrode to a portion that contacts with the surface of the semiconductor substrate, a surface of the first sidewall and the surface of the semiconductor substrate exposed from the first sidewall and gate dielectric film,
   wherein a lower end portion of the side surface of each silicon-germanium film that faces the gate electrode is formed in a planar shape along a direction perpendicular to the surface of the semiconductor substrate, an upper portion lying above the lower end portion is formed in a planar shape that is inclined and set to be separated farther apart from the gate electrode as the upper portion is separated away from the surface of the semiconductor substrate and the surface of the second silicide layer formed at least on the side portion of the silicon-germanium film that faces the gate electrode is set in a position higher than a channel region lying below the gate electrode.

2. The semiconductor device according to claim 1, wherein the first sidewall contains a silicon dioxide film.

3. The semiconductor device according to claim 1, wherein the second sidewall contains a silicon nitride film.

4. The semiconductor device according to claim 1, wherein the silicon-germanium films are filled into recessed regions respectively to sandwich the first sidewalls, gate electrodes and gate dielectric films.

5. The semiconductor device according to claim 4, wherein depth of the recessed region is set in a range of 20 to 200 nm.

6. The semiconductor device according to claim 1, wherein the silicon-germanium film having a facetless portion near the surface of the semiconductor substrate and a facet continuously to the facetless portion directly above the facetless portion.

7. The semiconductor device according to claim 1, wherein the silicon-germanium film contains impurity and concentration of the impurities differs for portions in the silicon-germanium film.

8. The semiconductor device according to claim 7, wherein the impurity is boron and a boron concentration is lower than $2 \times 10^{20}$ atoms/cm3.

* * * * *